(12) United States Patent
Luo et al.

(10) Patent No.: US 12,074,579 B2
(45) Date of Patent: Aug. 27, 2024

(54) ULTRA-WIDE PASSBAND FIVE-ORDER BAND-PASS FILTER BASED ON LTCC PROCESS

(71) Applicant: JIAXING GLEAD ELECTRONICS CO., LTD, Zhejiang (CN)

(72) Inventors: Changwei Luo, Zhejiang (CN); Kuan-Yu Lu, Zhejiang (CN); Jiayuan Hua, Zhejiang (CN); Feng Pan, Zhejiang (CN); Nan Liu, Zhejiang (CN); Lili Wang, Zhejiang (CN); Xing Xu, Zhejiang (CN)

(73) Assignee: JIAXING GLEAD ELECTRONICS CO., LTD, Zhejiang (CN)

( * ) Notice: Subject to any disclaimer, the term of this patent is extended or adjusted under 35 U.S.C. 154(b) by 224 days.

(21) Appl. No.: 17/778,015

(22) PCT Filed: Mar. 24, 2021

(86) PCT No.: PCT/CN2021/082523
§ 371 (c)(1),
(2) Date: May 19, 2022

(87) PCT Pub. No.: WO2022/083059
PCT Pub. Date: Apr. 28, 2022

(65) Prior Publication Data
US 2022/0399868 A1 Dec. 15, 2022

(30) Foreign Application Priority Data

Oct. 23, 2020 (CN) .......................... 202011147097.0

(51) Int. Cl.
*H03H 7/01* (2006.01)
*H01F 27/28* (2006.01)
(Continued)

(52) U.S. Cl.
CPC ........... *H03H 7/0115* (2013.01); *H01F 27/28* (2013.01); *H01F 27/40* (2013.01); *H01G 4/40* (2013.01);
(Continued)

(58) Field of Classification Search
CPC ..................... H03H 2001/0085; H03H 7/0115
(Continued)

(56) References Cited

U.S. PATENT DOCUMENTS

| 2006/0043580 | A1 | 3/2006 | Tsai et al. |
| 2008/0278259 | A1 | 11/2008 | Ni |
| 2023/0170870 | A1* | 6/2023 | Nobe ................... H03H 7/0161 333/185 |

FOREIGN PATENT DOCUMENTS

| CN | 102509829 | 6/2012 |
| CN | 102610885 | 7/2012 |

(Continued)

OTHER PUBLICATIONS

"International Search Report (Form PCT/ISA/210) of PCT/CN2021/082523," mailed on Jul. 21, 2021, pp. 1-5.
(Continued)

*Primary Examiner* — Rakesh B Patel
(74) *Attorney, Agent, or Firm* — Bayramoglu Law Offices, LLC

(57) ABSTRACT

The disclosure relates to an ultra-wide passband five-order band-pass filter based on an LTCC process. The ultra-wide passband five-order band-pass filter comprises a ceramic substrate, a bottom input electrode, a bottom output electrode and a bottom grounding electrode. Five parallel resonators, a grounding polar plate, two series connection capacitors, two series connection inductors, a cross-coupling capacitor and a parallel inductor are arranged in the ceramic substrate; the two series connection capacitors comprise a
(Continued)

first series capacitor and a second series capacitor; the two series connection inductors comprise a first series inductor and a second series inductor; and according to the filter, a five-order parallel resonance structure is adopted, out-of-band suppression is deepened through the five parallel resonance units, a cross coupling capacitor, a parallel inductor and two series connection inductors are innovatively introduced.

9 Claims, 8 Drawing Sheets

(51) Int. Cl.
*H01F 27/40* (2006.01)
*H01G 4/40* (2006.01)
*H03H 1/00* (2006.01)

(52) U.S. Cl.
CPC ... *H03H 7/1775* (2013.01); *H03H 2001/0085* (2013.01)

(58) Field of Classification Search
USPC .................................................. 333/175, 185
See application file for complete search history.

(56) References Cited

FOREIGN PATENT DOCUMENTS

| | | |
|---|---|---|
| CN | 106960996 | 7/2017 |
| CN | 110932699 | 3/2020 |
| CN | 112187209 | 1/2021 |

OTHER PUBLICATIONS

"Written Opinion of the International Searching Authority (Form PCT/ISA/237) of PCT/CN2021/082523," mailed on Jul. 21, 2021, pp. 1-4.

* cited by examiner

ULTRA-WIDE PASSBAND FIVE-ORDER BAND-PASS FILTER BASED ON LTCC PROCESS

CROSS-REFERENCE TO RELATED APPLICATION

This application is a 371 of international application of PCT application serial no. PCT/CN2021/082523, filed on Mar. 24, 2021, which claims the priority benefit of China application no. 202011147097.0, filed on Oct. 23, 2020. The entirety of each of the above mentioned patent applications is hereby incorporated by reference herein and made a part of this specification.

TECHNICAL FIELD

The disclosure relates to the technical field of filters, in particular to an ultra-wide passband five-order band-pass filter based on an LTCC process.

DESCRIPTION OF RELATED ART

With the rapid development of communication technology, the global communication industry has entered the 5G era. LTCC is low temperature co-sintering ceramics, which allows three major passive devices (resistors, capacitors, inductors) and various passive devices (such as filters, transformers, etc.) to be packaged into multilayer wiring substrate, and can be integrated with active devices (such as power MOS, transistor, IC module, etc.) to form a complete circuit system. LTCC has been commonly adopted in various types of mobile phones, Bluetooth, GPS modules, WLAN modules, WIFI modules, etc. In addition, due to the high reliability of LTCC products, the application thereof has been widely adopted in automotive electronics, communications, aerospace and military, MEMS, sensor technology and other fields.

With the advent of the 5G era, LTCC plays an important role because LTCC can adapt to high current and has high temperature resonance. Ranging from mobile phones, wearable devices to automobiles and other fields, RF components are necessarily involved. LTCC serves as a key component. In terms of application in mobile phones, the number of 5G mobile phones in use has increased by 40% compared with 4G mobile phones, which has pushed up the demand for LTCC to grow significantly.

Typically there are three ways to realize the LTCC band-pass filter: the first is the conventional parallel resonance band-pass filter, which is realized by a parallel resonance unit composed of an inductor and a capacitor connected in parallel; the second is the use of distributed capacitor plate, and an effect of the band-pass filter is achieved through the coupling between polar plates; the third is the use of a high-pass filter and a low-pass filter connected in series. The band-pass filters realized by the above three structures have their own advantages and shortcomings in fabrication and design. The near-band suppression of the conventional parallel resonance structure band-pass filter is deeper than the other two, but with the increase of parallel resonance units, the pass-band insertion loss of such filter continues to increase, and the loss of the signal is difficult to control. In the case of a band-pass filter with a distributed structure, the design is simple, and debug is easy with balanced electrical properties. However, because the structure is mainly realized by the coupling between polar plates, the requirements for the production process are higher. Problems are often encountered in the LTCC diaphragm stacking and cutting and sintering process, and the batch consistency is poor. The band-pass filter using the serially-connected structure of the high-pass filter and the low-pass filter has a wider passband, better insertion loss, and high signal fidelity, but the out-of-band suppression is poor, and the structure is complicated while it is difficult to debug.

SUMMARY

Technical Problem

In order to solve the above technical problems, the purpose of the present disclosure is to provide an ultra-wide passband five-order band-pass filter based on LTCC process. Such filter is small in size and solves the problem of conventional filters with narrow passband and large insertion loss.

Technical Solution

In order to realize the above-mentioned purpose of the disclosure, the present disclosure adopts the following technical solutions. An ultra-wide passband five-order band-pass filter based on an LTCC process includes a ceramic substrate, a bottom input electrode, a bottom output electrode and a bottom grounding electrode. The ceramic substrate includes five parallel resonators, a grounding polar plate SD, two series connection capacitors, two series connection inductors, a cross-coupling capacitor C15 and a parallel inductor L24. The two series connection capacitors include a first series capacitor C12 and a second series capacitor C45. The two series connection inductors include a first series inductor L23 and a second series inductor L34. The five parallel resonance units are distributed in mirror symmetry, including a first parallel resonator composed of a first inductor L1 and a first parallel resonance capacitor CC1, a second parallel resonator composed of a second inductor L2 and a second parallel resonance capacitor CC2, a third parallel resonator composed of a third inductor L3 and a third parallel resonance capacitor CC3, a fourth parallel resonator composed of a fourth inductor L4 and a fourth parallel resonance capacitor CC4, and a fifth parallel resonator composed of a fifth inductor L5 and a fifth parallel resonance capacitor CC5. The first parallel resonator and the second parallel resonator are connected through the first series capacitor C12, the second parallel resonator and the third parallel resonator are connected through the first series inductor L23, the third parallel resonator and the fourth parallel resonator are connected through the second series inductor L34, the fourth parallel resonator and the fifth parallel resonator are connected through the second series capacitor C45. The lower end of the first parallel resonance capacitor CC1 is connected to the bottom input electrode through a hole pillar Hin. The lower end of the fifth parallel resonance capacitor CC5 is connected to the bottom output electrode through a hole pillar Hout. The grounding polar plate SD is located at the bottommost layer inside the ceramic substrate and is connected to the bottom grounding electrode through a hole pillar Hsd.

In a preferred solution: the interior of the ceramic substrate is divided into ten layers, and the grounding polar plate SD is located on the tenth layer of the ceramic substrate. The first inductor L1 includes a hole pillar H11, a double-layer polar plate J1 and a hole pillar H12. The double-layer polar plate J1 is located on the first layer and the second layer of the ceramic substrate. The hole pillar H11 is located between the first layer and the tenth layer of the ceramic substrate, the upper end is connected to the double-layer polar plate J1, and the lower end is connected to the grounding polar plate SD. The hole pillar H12 is located between the first layer and the eighth layer of the ceramic substrate, the upper end is connected to the double-layer polar plate J1, and the lower end is connected to the first parallel resonance capacitor CC1. The first parallel resonance capacitor CC1 is located on the sixth layer and the eighth layer of the ceramic substrate. The left end is connected to the hole pillar H12 of the first inductor L1, the first series capacitor C12 is located on the sixth and eighth layers of the ceramic substrate, and the left ends of the two layers are connected to the right end of the first parallel resonance capacitor CC1.

In a preferred solution: the second inductor L2 includes a hole pillar H21, a double-layer polar plate J2, and a hole pillar H22. The double-layer polar plate J2 is located on the first layer and the second layer of the ceramic substrate. The hole pillar H21 is located between the first layer and the tenth layer of the ceramic substrate, the upper end is connected to the double-layer polar plate J2, and the lower end is connected to the grounding polar plate SD. The hole pillar H22 is located between the first layer and the ninth layer of the ceramic substrate, and the upper end is connected to the double-layer polar plate J2. The second parallel resonance capacitor CC2 is located on the seventh layer and the ninth layer of the ceramic substrate, and is connected to the lower end of the hole pillar H22 of the second inductor L2.

In a preferred solution: the third inductor L3 includes a hole pillar H31, a double-layer polar plate J3, and a hole pillar H32. The double-layer polar plate J3 is located on the first layer and the second layer of the ceramic substrate. The hole pillar H31 is located between the first layer and the tenth layer of the ceramic substrate, the upper end is connected to the double-layer polar plate J2, and the lower end is connected to the grounding polar plate SD. The hole pillar H32 is located between the first layer and the ninth layer of the ceramic substrate, and the upper end is connected to the double-layer polar plate J3. The third parallel resonance capacitor CC3 is located on the seventh and ninth layers of the ceramic substrate, and is connected to the lower end of the hole pillar H32 of the third inductor L3. The first series inductor L23 is located on the third layer of the ceramic substrate, and the left end is connected to the hole pillar H21 of the second inductor L2, and the right end is connected with the hole pillar H31 of the third inductor L3.

In a preferred solution: the fourth inductor L4 includes a hole pillar H41, a double-layer polar plate J4, and a hole pillar H42. The double-layer polar plate J4 is located on the first layer and the second layer of the ceramic substrate. The hole pillar H41 is located between the first layer and the tenth layer of the ceramic substrate, the upper end is connected to the double-layer polar plate J4, and the lower end is connected to the grounding polar plate SD. The hole pillar H42 is located between the first layer and the ninth layer of the ceramic substrate, and the upper end is connected to the double-layer polar plate J4. The fourth parallel resonance capacitor CC4 is located on the seventh and ninth layers of the ceramic substrate, and is connected to the lower end of the hole pillar H42 of the fourth inductor L4. The second series inductor L34 is located on the third layer of the ceramic substrate, the left end is connected to the hole pillar H31 of the third inductor, and the right end is connected with the hole pillar H41 of the fourth inductor L4.

In a preferred solution: the fifth inductor L5 includes a hole pillar H51, a double-layer polar plate J5, and a hole pillar H52. The double-layer polar plate J5 is located on the first layer and the second layer of the ceramic substrate. The hole pillar H51 is located between the first layer and the tenth layer of the ceramic substrate, the upper end is connected to the double-layer polar plate J5, and the lower end is connected to the grounding polar plate SD. The hole pillar H52 is located between the first layer and the eighth layer of the ceramic substrate, and the upper end is connected to the double-layer polar plate J5. The fifth parallel resonance capacitor CC5 is located on the sixth and eighth layers of the ceramic substrate, the left end is connected to the lower end of the hole pillar H52 of the fifth inductor L5, and the right end is connected to the second series capacitor C45.

In a preferred solution: the cross-coupling capacitor C15 is located on the fifth layer of the ceramic substrate, and adopts an in-line structure to form coupling with the sixth-layer polar plate of the first parallel resonance capacitor CC1 and the sixth-layer polar plate of the fifth parallel resonance capacitor CC5. The parallel inductor L24 is located on the third layer of the ceramic substrate, adopts a C-shaped structure, and is respectively connected with the hole pillar H21 of the second inductor L2 and the hole pillar H41 of the fourth inductor L4.

In a preferred solution: the hole pillars of the first inductor L1, the second inductor L2, the third inductor L3, the fourth inductor L4, and the fifth inductor L5 all adopt a pillar-shaped metal hole pillar structure. The first parallel resonance capacitor CC1, the second parallel resonance capacitor CC2, the third parallel resonance capacitor CC3, the fourth parallel resonance capacitor CC4, the fifth parallel resonance capacitor CC5 and the cross-coupling capacitor C15 all adopt the structure of a pair of flat capacitor plates. The first series capacitor C12 and the second series capacitor C45 adopt a vertical in-line capacitor plate structure.

In a preferred solution: the structures of the first parallel resonator and the fifth parallel resonator, the second parallel resonator and the fourth parallel resonator, the first series capacitor C12 and the second series capacitor C45, and the first series inductor L23 and the second series inductor L34 are mirror-symmetrical, and the structures of the third parallel resonator, the cross-coupling capacitor C15, and the parallel inductor L24 are centrally symmetrical.

In a preferred solution: the material of the ceramic substrate is a ceramic material with the dielectric constant of 9.8 and the dissipation factor of 0.003, and the bottom grounding electrode, bottom input electrode, and bottom output electrode are all printed with silver material. The passband range of the filter is 3.64 to 7.04 GHz, the maximum insertion loss of the passband is 1.75 dB, and the suppression in the low-end stopband 0 to 3 GHz is more than 30 dB. The suppression in the high-end stopband 7.8 GHz to 12.5 GHz is more than 30 dB. The suppression of triple frequency 12.5 to 17 GHz is more than 15 dB.

Advantageous Effect

Compared with the conventional technology, the advantageous effects of the present disclosure are as follows. The present disclosure provides an ultra-wide passband five-order band-pass filter based on the LTCC process, aiming at solving the problem that the passband of the existing LTCC band-pass filter with parallel resonator structure is too narrow, and the suppression of the high-pass filter and the low-pass filter with series structure is not deep. The filter adopts a five-order parallel resonator structure, five parallel resonance units deepen the out-of-band suppression, and innovatively introduces a cross-coupling capacitor, a parallel inductor and two series connection inductors, which greatly broadens the passband of the band-pass filter, deepens three times of out-of-band suppression, and changes the conventional five-order band-pass filter with the problem of narrow passband and large insertion loss.

BRIEF DESCRIPTION OF THE DRAWINGS

The accompanying drawings that constitute a part of the present disclosure are used to provide further understanding of the present disclosure, and the schematic embodiments and descriptions of the present disclosure are used to explain the present disclosure and do not constitute a limitation to the present disclosure.

DESCRIPTION OF THE EMBODIMENTS

The present disclosure will be further described below with reference to the accompanying drawings and embodiments.

In order to illustrate the technical embodiments of the present disclosure more clearly and in detail, the present disclosure will be further described in detail below with reference to the accompanying drawings.

Figure 1:
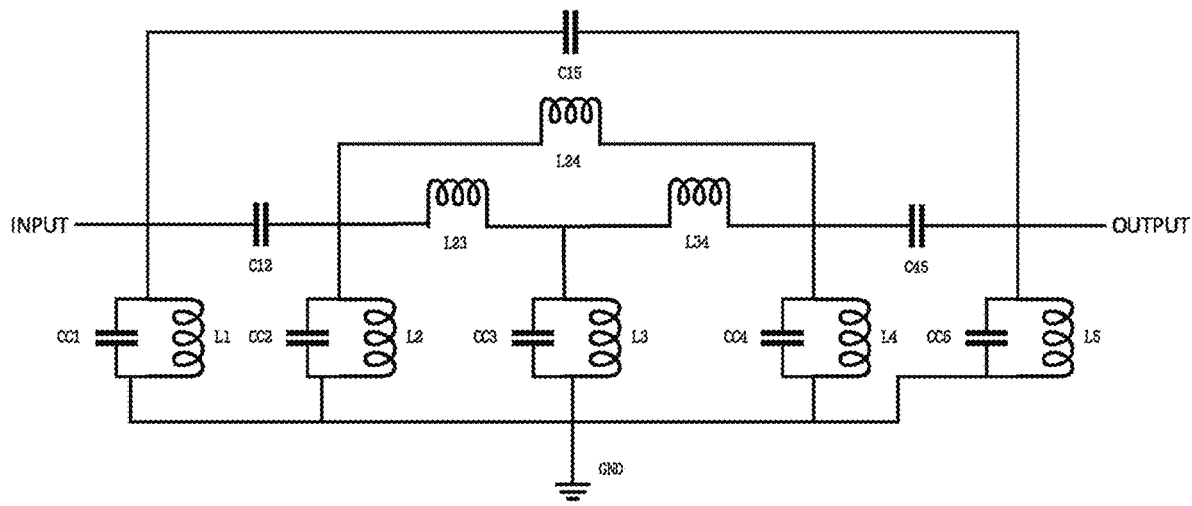
FIG. 1 is an equivalent circuit schematic diagram of an LTCC band-pass filter of the present disclosure.

FIG. 1 is an equivalent circuit schematic diagram of an LTCC band-pass filter of the present disclosure. As shown in FIG. 1, the main body of the present disclosure adopts a conventional five-order pass filter, including a first parallel resonator composed of a first inductor L1 and a first parallel resonance capacitor CC1, a second parallel resonator composed of a second inductor L2 and a second parallel resonance capacitor CC2, a third parallel resonator composed of a third inductor L3 and a third parallel resonance capacitor CC3, a fourth parallel resonator composed of a fourth inductor L4 and a fourth parallel resonance capacitor CC4, and a fifth parallel resonator composed of a fifth inductor L5 and a fifth parallel resonance capacitor CC5. The first parallel resonator and the second parallel resonator are connected through the first series capacitor C12, and the fourth parallel resonator and the fifth parallel resonator are connected through the second series capacitor C45. In a conventional five-order pass filter, the present disclosure introduces two series inductors L23 connected to the second parallel resonator and the third parallel resonator, the series inductor L34 connected to the third parallel resonator and the fourth parallel resonator, the parallel inductor L34 connected to the second parallel resonator and the fourth parallel resonator, and the cross-coupling capacitor C15. As such, the passband is significantly widened, and the suppression of the near end and the triple frequency of the passband is increased.

Figure 2:
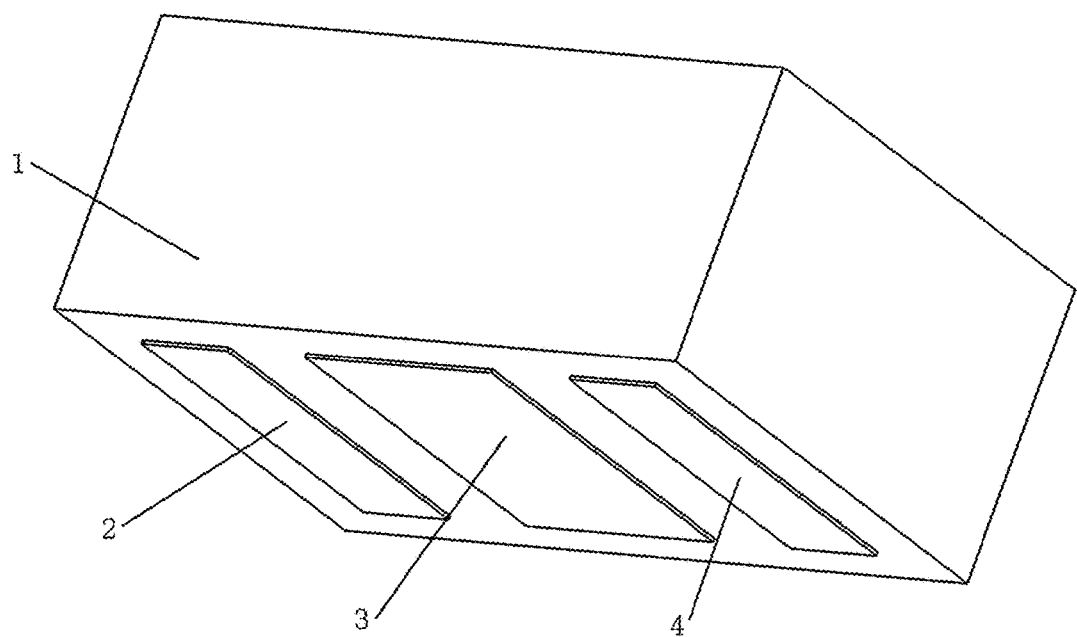
FIG. 2 is a schematic view of the external structure of the LTCC band-pass filter of the present disclosure.
Figure 3:
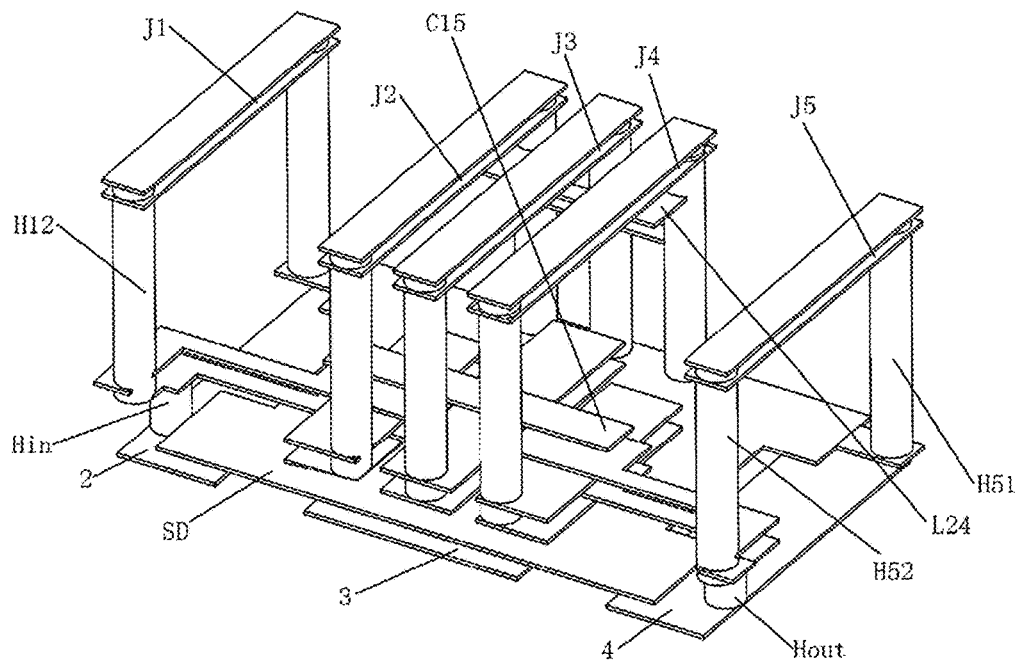
FIG. 3 is a schematic diagram of the internal overall structure of the LTCC band-pass filter of the present disclosure.
Figure 4:
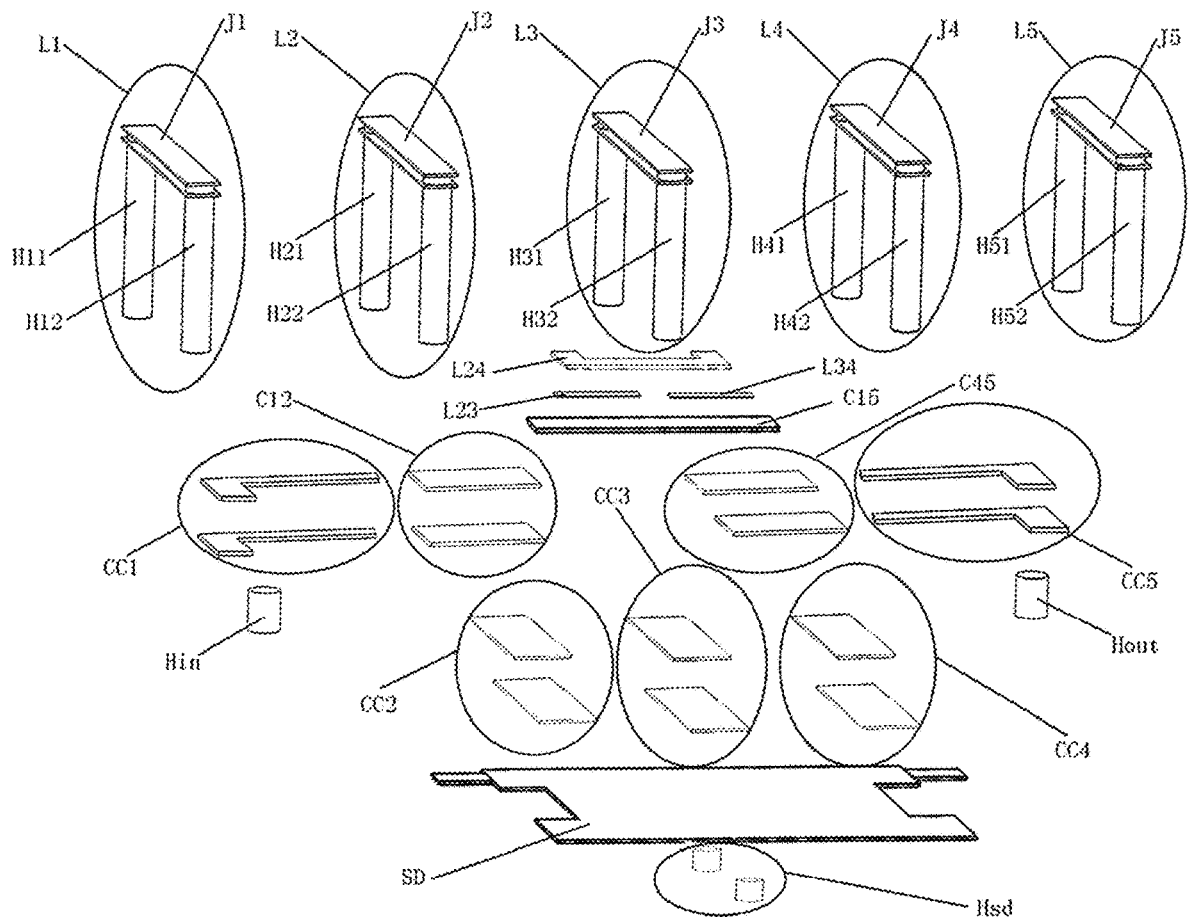
FIG. 4 is a schematic explosive view of the internal overall structure of the LTCC band-pass filter of the present disclosure.
Figure 5:
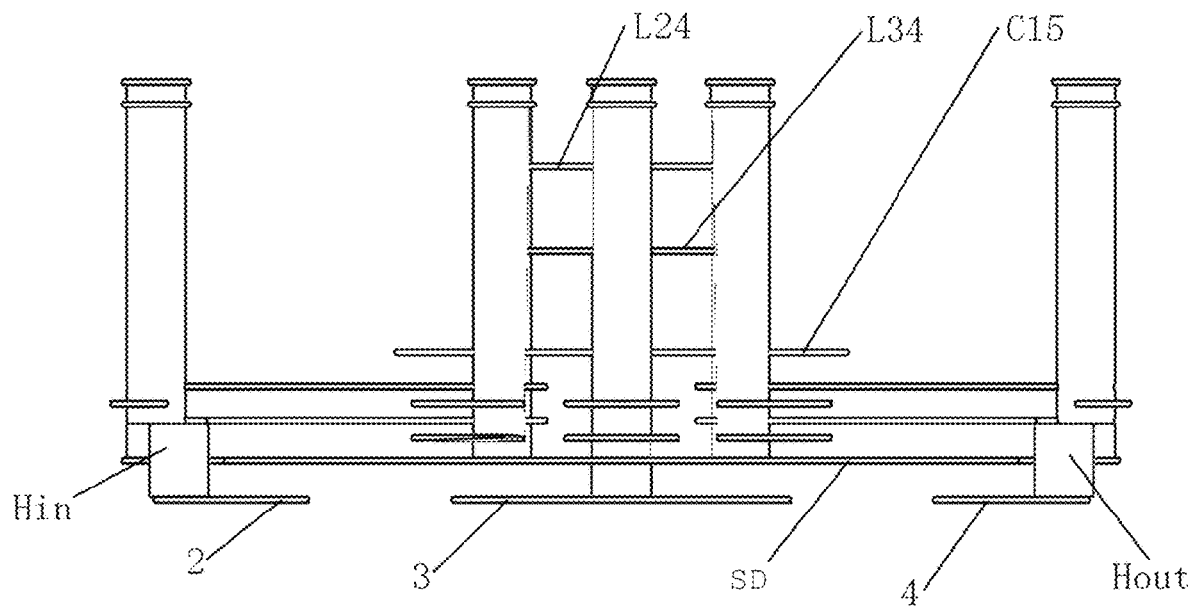
FIG. 5 is a schematic front view of the internal structure of the LTCC band-pass filter of the present disclosure.
Figure 6:
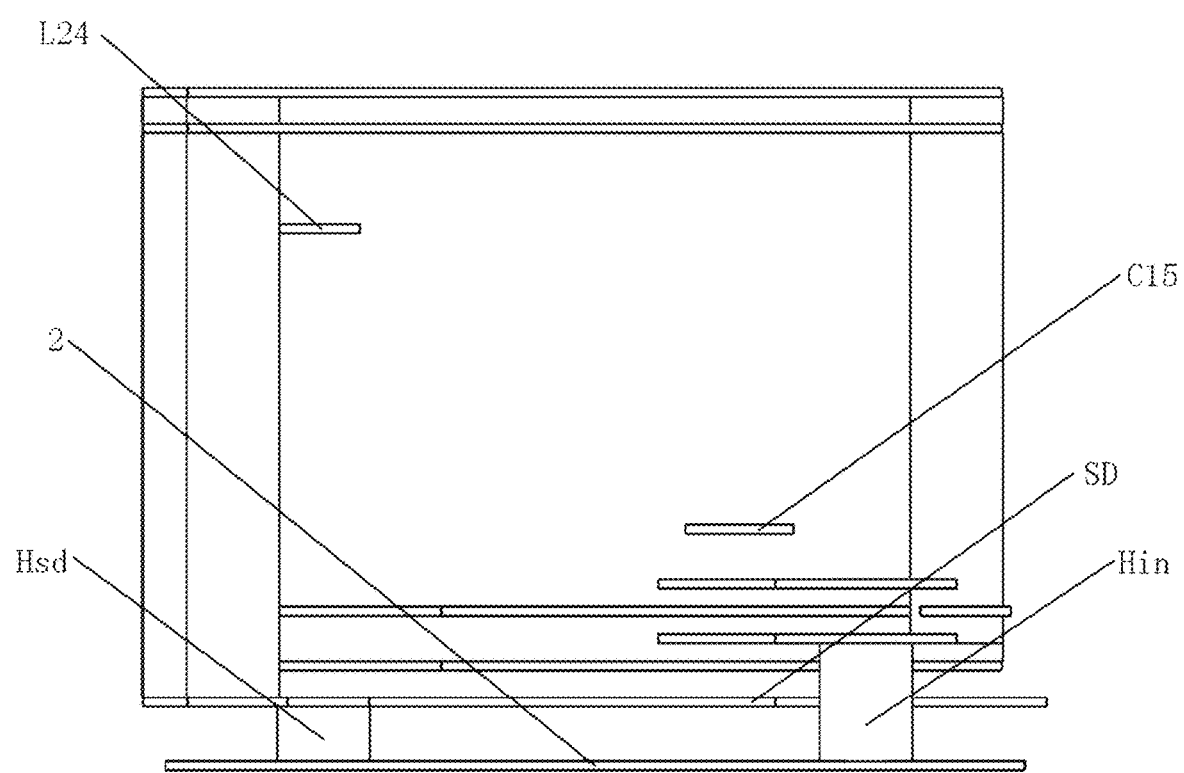
FIG. 6 is a schematic side view of the internal structure of the LTCC band-pass filter of the present disclosure.
Figure 7:
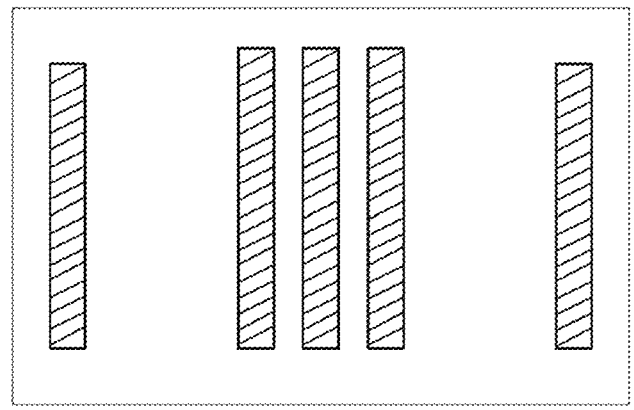
FIG. 7 is a structural plan view of the $1^{st}$ layer of the LTCC band-pass filter of the present disclosure.
Figure 8:
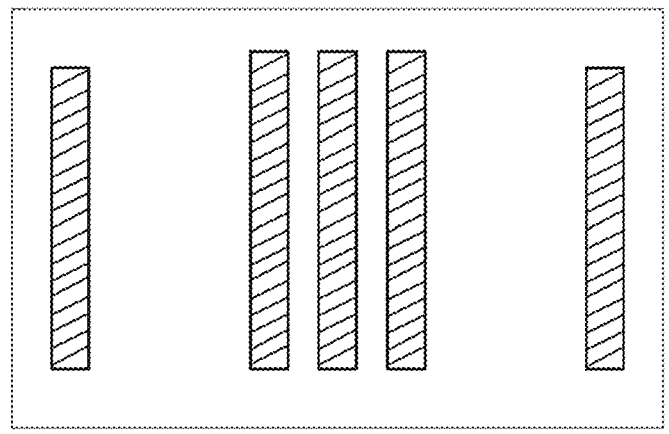
FIG. 8 is a structural plan view of the $2^{nd}$ layer of the LTCC band-pass filter of the present disclosure.
Figure 9:
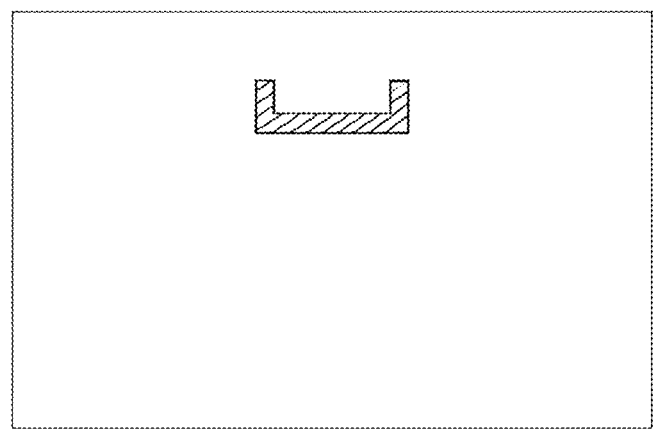
FIG. 9 is a structural plan view of the $3^{rd}$ layer of the LTCC band-pass filter of the present disclosure.
Figure 10:
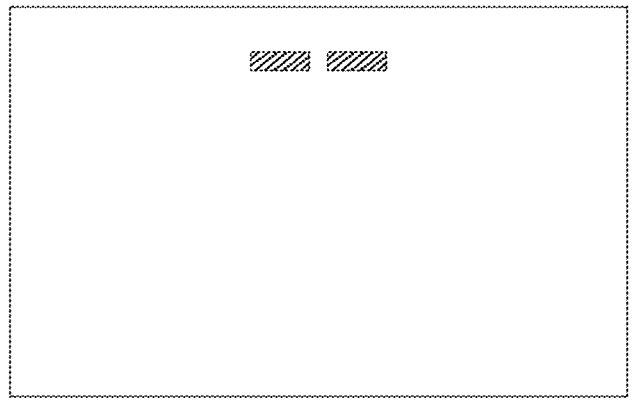
FIG. 10 is a structural plan view of the $4^{th}$ layer of the LTCC band-pass filter of the present disclosure.
Figure 11:
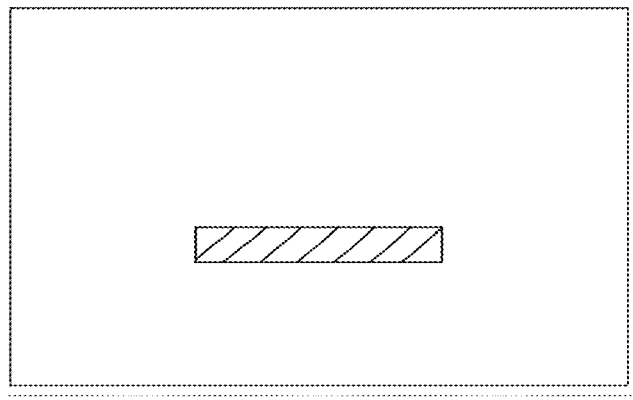
FIG. 11 is a structural plan view of the $5^{th}$ layer of the LTCC band-pass filter of the present disclosure.
Figure 12:
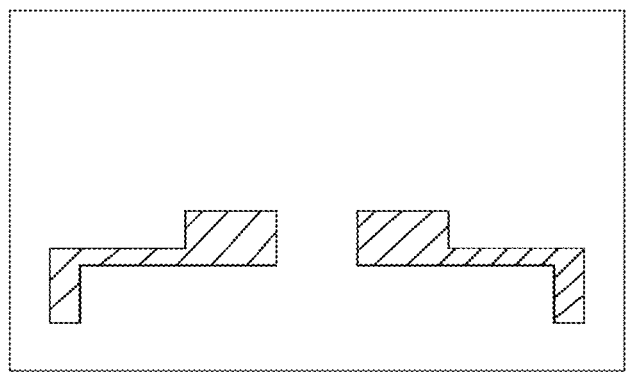
FIG. 12 is a structural plan view of the $6^{th}$ layer of the LTCC band-pass filter of the present disclosure.
Figure 13:
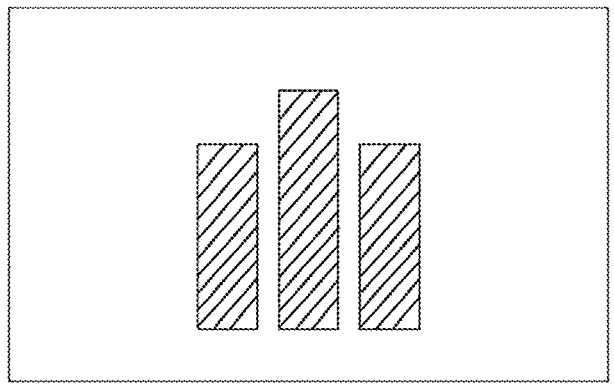
FIG. 13 is a structural plan view of the $7^{th}$ layer of the LTCC band-pass filter of the present disclosure.
Figure 14:
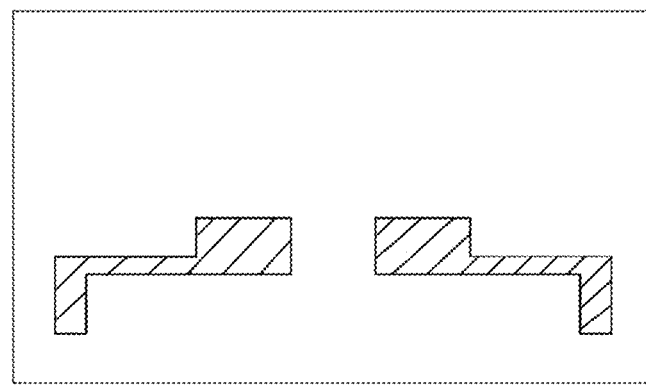
FIG. 14 is a structural plan view of the $8^{th}$ layer of the LTCC band-pass filter of the present disclosure.
Figure 15:
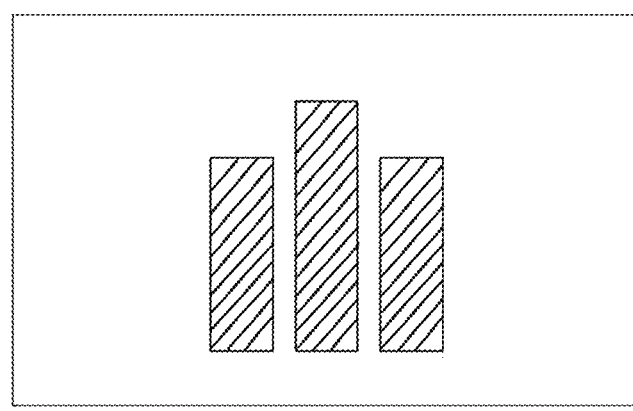
FIG. 15 is a structural plan view of the $9^{th}$ layer of the LTCC band-pass filter of the present disclosure.
Figure 16:
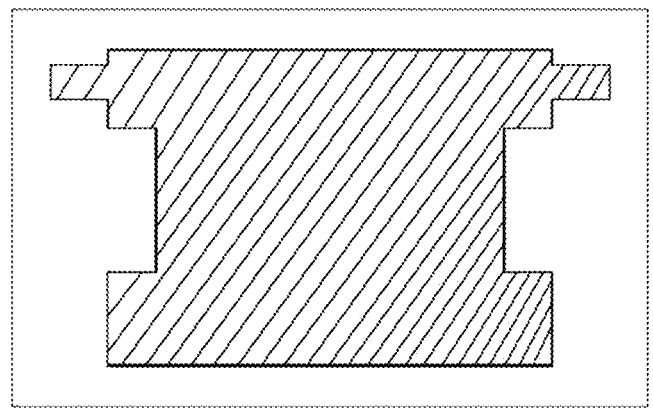
FIG. 16 is a structural plan view of the $10^{th}$ layer of the LTCC band-pass filter of the present disclosure.

FIG. 2 is a schematic view of the external structure of the LTCC band-pass filter of the present disclosure, including a ceramic substrate, a bottom input electrode, a bottom output electrode, and a bottom grounding electrode. The overall external size of the present disclosure is 2.0 mm×1.25 mm×0.8 mm, and the ceramic material is adopted with a dielectric constant of 9.8 and a dissipation factor of 0.003. The external input electrode, external output electrode, the bottom input electrode and the bottom output electrode are printed on the left and right sides of the bottom of the ceramic substrate in a mirror image distribution. The bottom grounding electrode is printed on the center of the bottom of the ceramic substrate.

As shown in FIG. 3 to FIG. 6, the internal structure of the present disclosure is divided into ten layers. The grounding polar plate SD is located on the tenth layer of the ceramic substrate, and is connected to the bottom grounding electrode through the hole pillar Hsd. The five parallel resonance units included therein are distributed in mirror symmetry, including a first parallel resonator composed of a first inductor L1 and a first parallel resonance capacitor CC1, a second parallel resonator composed of a second inductor L2 and a second parallel resonance capacitor CC2, a third parallel resonator composed of a third inductor L3 and a third parallel resonance capacitor CC3, a fourth parallel resonator composed of a fourth inductor L4 and a fourth parallel resonance capacitor CC4, and a fifth parallel resonator composed of a fifth inductor L5 and a fifth parallel resonance capacitor CC5. The first parallel resonator and the second parallel resonator are connected through the first series capacitor C12, the second parallel resonator and the third parallel resonator are connected through the first series inductor L23, the third parallel resonator and the fourth parallel resonator are connected through the second series inductor L34, the fourth parallel resonator and the fifth parallel resonator are connected through the second series capacitor C45. The first parallel resonator and the fifth parallel resonator, the second parallel resonator and the fourth parallel resonator, the first series capacitor C12 and the second series capacitor C45, and the first series inductor L23 and the second series inductor L34 have the same mirror-symmetric structure.

The first inductor L1 adopts a hole pillar-polar plate-hole pillar structure, including a hole pillar H11 connected to the grounding polar plate, a double-layer polar plate J1, and a hole pillar H12 connected to the first parallel resonance capacitor CC1. The double-layer polar plate J1 is located on the first and second layers of the ceramic substrate. The hole pillar H11 connected to the grounding polar plate is located between the first and tenth layers of the ceramic substrate. The hole pillar H12 connected to the first parallel resonance capacitor CC1 is located between the first layer and the eighth layer of the ceramic substrate. The upper end of the hole pillar H11 connected with the grounding polar plate is connected to the double-layer polar plate J1, and the lower end is connected to the grounding polar plate SD. The upper end of the hole pillar H12 connected to the first parallel resonance capacitor CC1 is connected to the double-layer polar plate J1, and the lower end is connected to the first parallel resonance capacitor CC1. The first parallel resonance capacitor CC1 is located on the sixth and eighth layers of the ceramic substrate, the left end is connected to the hole pillar H12 of the first inductor L1, the right end is connected to the first series capacitor C12, and the lower end is connected to the bottom input electrode through the hole pillar Hin.

The first series capacitor C12 is located on the sixth layer and the eighth layer of the ceramic substrate, and the left ends of the two layers are both connected to the first parallel resonance capacitor CC1.

The second inductor L2 adopts a hole pillar-polar plate-hole pillar structure, including a hole pillar H21 connected to the grounding polar plate, a double-layer polar plate J2, and a hole pillar H22 connected to the second parallel resonance capacitor CC2. The double-layer polar plate J2 is located on the first layer and the second layer of the ceramic substrate, the hole pillar H21 connected to the grounding polar plate is located between the first layer and the tenth layer of the ceramic substrate. The hole pillar H22 connected to the second parallel resonance capacitor CC2 is located between the first layer and the ninth layer of the ceramic substrate. The upper end of the hole pillar H21 connected to the grounding polar plate is connected to the double-layer polar plate J2, and the lower end is connected to the grounding polar plate SD. The upper end of the hole pillar H22 connected to the second parallel resonance capacitor CC2 is connected to the double-layer polar plate J2, and the lower end is connected to the second parallel resonance capacitor CC2. The second parallel resonance capacitor CC2 is located on the seventh and ninth layers of the ceramic substrate, and is connected to the hole pillar H22 of the second inductor L2.

The third inductor L3 adopts a hole pillar-polar plate-hole pillar structure, including a hole pillar H31 connected to the grounding polar plate, a double-layer polar plate J3, and a hole pillar H32 connected to the third parallel resonance capacitor CC3. The double-layer polar plate J3 is located on the first and second layers of the ceramic substrate. The hole pillar H31 connected to the grounding polar plate is located between the first and tenth layers of the ceramic substrate. The hole pillar H32 connected to the third parallel resonance capacitor CC3 is located between the first layer and the ninth layer of the ceramic substrate. The upper end of the hole pillar H31 connected to the grounding polar plate is connected to the double-layer polar plate J2, and the lower end is connected to the grounding polar plate SD. The upper end of the hole pillar H32 connected to the third parallel resonance capacitor CC3 is connected to the double-layer polar plate J3, and the lower end is connected to the third parallel resonance capacitor CC3. The third parallel resonance capacitor CC3 is located on the seventh and ninth layers of the ceramic substrate, and is connected to the hole pillar H32 of the third inductor L3.

The first series inductor L23 is located on the third layer of the ceramic substrate, the left end is connected to the hole pillar H21 of the second inductor L2, and the right end is connected to the hole pillar H31 of the third inductor L3.

The fourth inductor L4 adopts a hole pillar-polar plate-hole pillar structure, including a hole pillar H41 connected to the grounding polar plate, a double-layer polar plate J4, and a hole pillar H42 connected to the fourth parallel resonance capacitor CC4. The double-layer polar plate J4 is located on the first and second layers of the ceramic substrate. The hole pillar H41 connected with the grounding polar plate is located between the first and tenth layers of the ceramic substrate. The hole pillar H42 connected with the fourth parallel resonance capacitor CC4 is located between the first layer and the ninth layer of the ceramic substrate. The upper end of the hole pillar H41 connected to the grounding polar plate is connected to the double-layer polar plate J4, and the lower end is connected to the grounding polar plate SD. The upper end of the hole pillar H42 connected to the fourth parallel resonance capacitor CC4 is connected to the double-layer polar plate J4, and the lower end is connected to the fourth parallel resonance capacitor CC4. The fourth parallel resonance capacitor CC4 is located on the seventh and ninth layers of the ceramic substrate, and is connected to the hole pillar H42 of the fourth inductor L4.

The second series inductor L34 is located on the third layer of the ceramic substrate, the left end is connected to the hole pillar H31 of the third inductor L3, and the right end is connected to the hole pillar H41 of the fourth inductor L4.

The fifth inductor L5 adopts a hole pillar-polar plate-hole pillar structure, including a hole pillar H51 connected to the grounding polar plate, a double-layer polar plate J5, and a hole pillar H52 connected to the fifth parallel resonance capacitor CC5. The double-layer polar plate J5 is located on the first and second layers of the ceramic substrate. The hole pillar H51 connected to the grounding polar plate is located between the first and tenth layers of the ceramic substrate. The hole pillar H52 connected to the fifth parallel resonance capacitor CC5 is located between the first layer and the eighth layer of the ceramic substrate. The upper end of the hole pillar H51 connected to the grounding polar plate is connected to the double-layer polar plate J5, and the lower end is connected to the grounding polar plate SD. The upper end of the hole pillar H52 connected to the fifth parallel resonance capacitor CC5 is connected to the double-layer polar plate J5, and the lower end is connected to the fifth parallel resonance capacitor CC5. The fifth parallel resonance capacitor CC5 is located on the sixth and eighth layers of the ceramic substrate, the left end is connected to the hole pillar H52 of the fifth inductor L5, the left end is connected to the second series capacitor C45, and the lower end is connected to the bottom output electrode through the hole pillar Hout.

The cross-coupling capacitor C15 is located on the fifth layer of the ceramic substrate, and is coupled with the sixth-layer polar plate of the first parallel resonance capacitor CC1 and the sixth-layer polar plate of the fifth parallel resonance capacitor CC5 with an in-line structure. The parallel inductor L24 is located on the third layer of the ceramic substrate, which adopts a C-type structure and is respectively connected with the hole pillar H21 of the second inductor L2 and the hole pillar H41 of the fourth inductor L4.

The specific structures of each layer of the band-pass filter described above are shown in FIG. 7 to FIG. 16. The capacitor of the band-pass filter mentioned above is adopted in combination with the vertical in-line type (VIC type) and the planar type (MIM type), aiming to achieve the required capacitance value in the minimized space and reduce the volume occupied by the capacitor plate. In the layout of internal structure, the five parallel resonance units adopt a mirror-symmetric design, which rationally optimizes the internal space structure, reduces the difficulty of design and debugging and avoids errors in the production process. The volume of the filter is only 2.0 mm×1.25 mm×0.8 mm.

Figure 17:
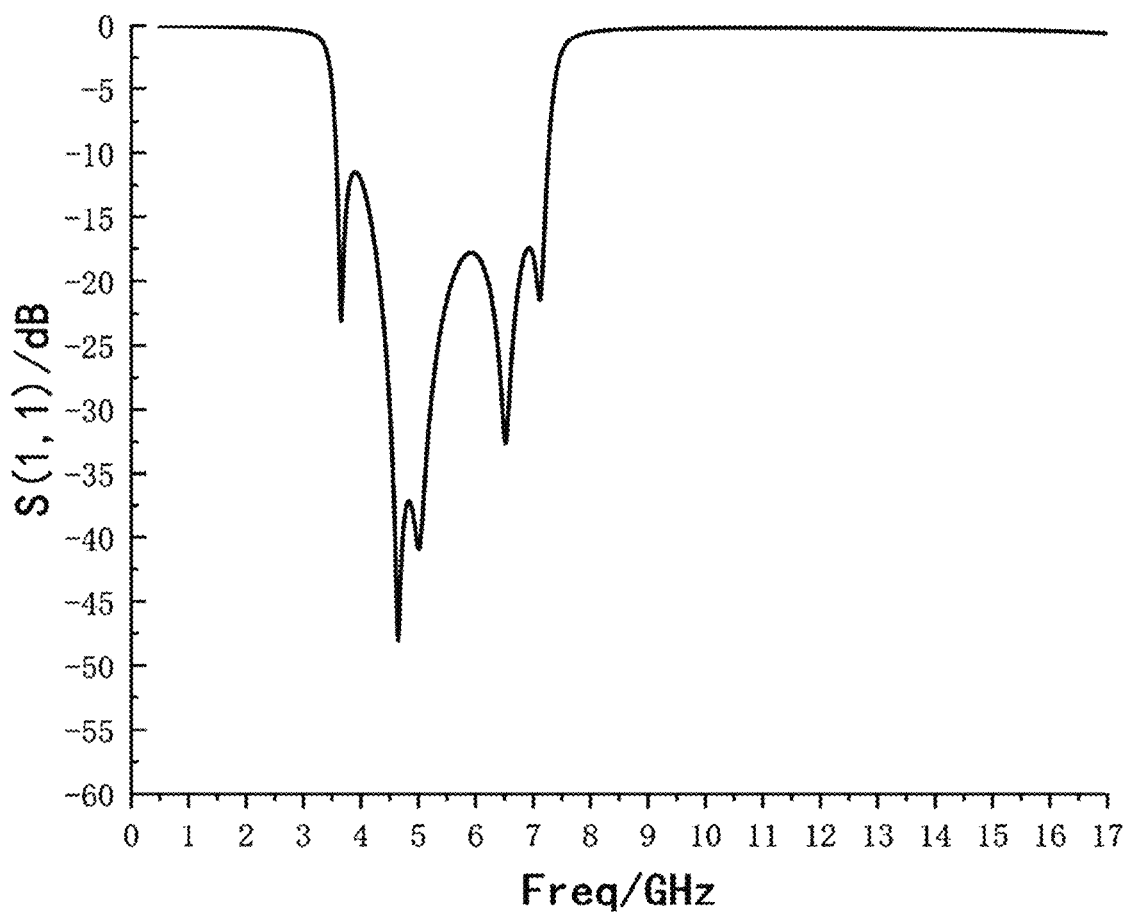
FIG. 17 is a simulation result diagram of S11 of the LTCC band-pass filter of the present disclosure.
Figure 18:
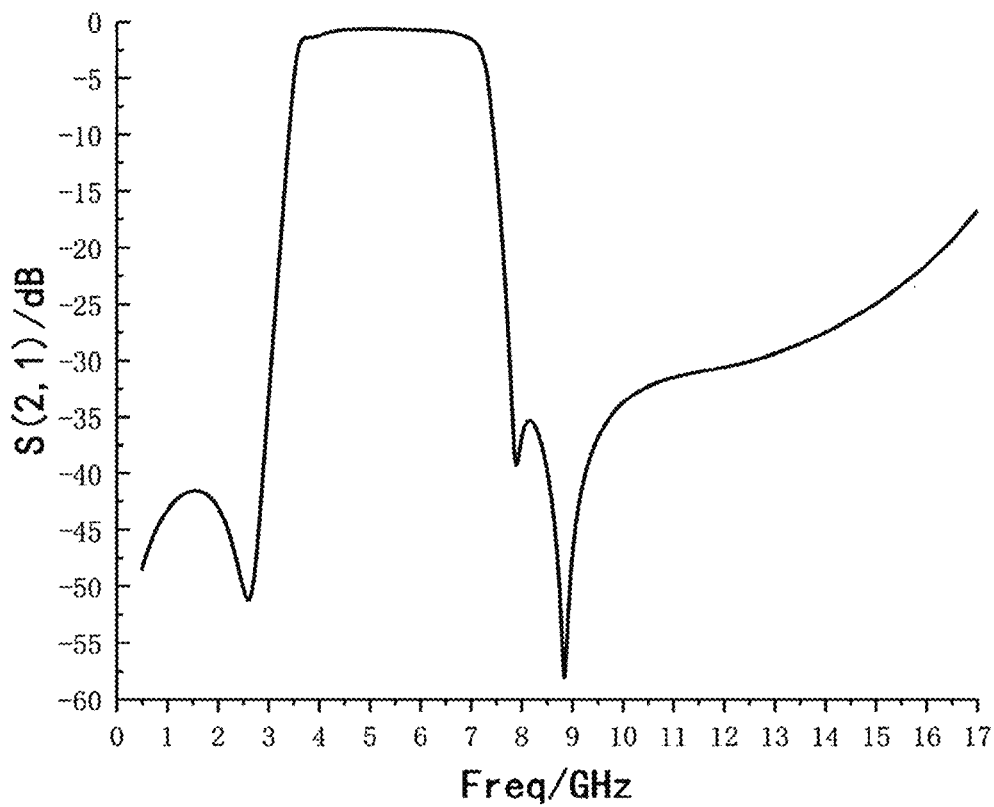
FIG. 18 is a simulation result diagram of S21 of the LTCC band-pass filter of the present disclosure.
Figure 19:
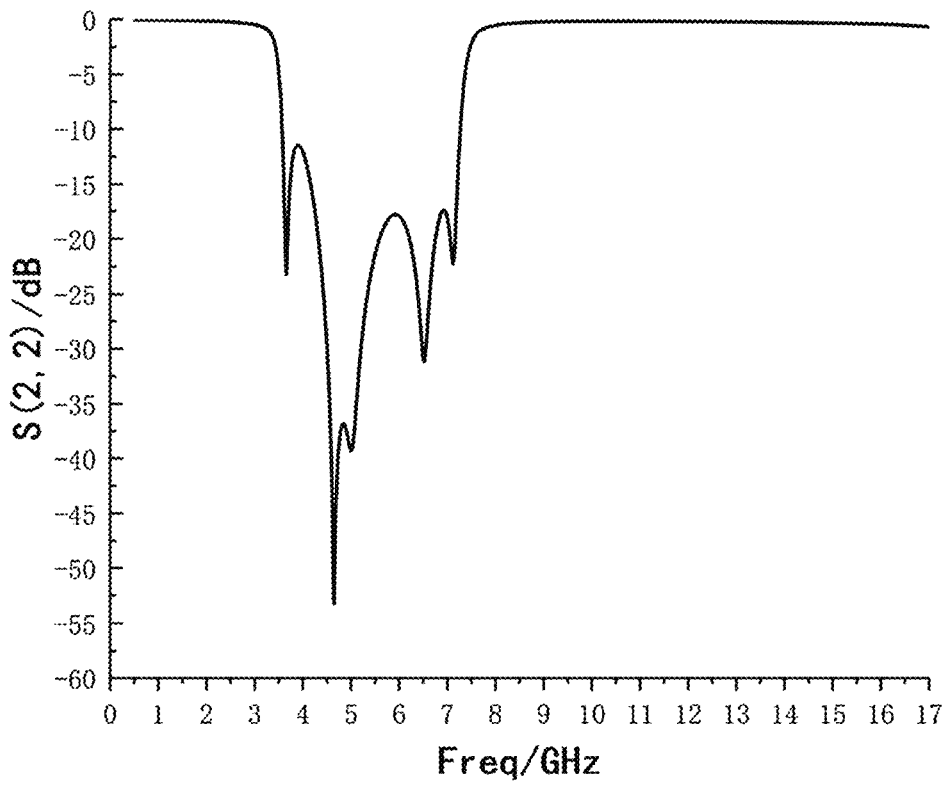
FIG. 19 is a simulation result diagram of S22 of the LTCC band-pass filter of the present disclosure.

FIG. 17 to FIG. 19 are simulation result diagrams of the band-pass filter parameter of the present disclosure. As shown in the figure, the passband range of the band-pass filter is 3.64 to 7.04 GHz, the maximum insertion loss of the passband is 1.75 dB, the suppression in the low-end stopband 0 to 3 GHz is more than 30 dB, the suppression in the high-end stopband 7.8 GHz to 12.5 GHz is more than 30 dB; the suppression of triple frequency 12.5 to 17 GHz is more than 15 dB.

To sum up, the advantageous effects of the present disclosure are as follows. (1) The use of hole pillar-polar plate-hole pillar structure inductors avoids the problems of LTCC conventional multi-layer spiral fold-line inductors occupying a large space, difficulty in debugging, and high production process requirements. In the meantime, the use of inductor with such structure may increase the coupling capacitance between the inductors, reduce the volume of the series capacitor between two parallel resonance units, so that the device is miniaturized.

(2) On basis of the conventional five-order band-pass filter, by innovatively introducing a parallel inductor connected to the second parallel resonance unit and the fourth parallel resonance unit, two series connection inductors connected to the second parallel resonance unit and the third parallel resonance unit, as well as the third parallel resonance unit and the fourth parallel resonance unit, the passband is greatly widened. The designed band-pass filter has a passband width of 3.4 GHz, and the insertion loss is controlled within 1.75 dB, which solves the problem of conventional five-order band-pass filter with narrow passband and large insertion loss.

(3) By introducing a parallel inductor connected to the second parallel resonance unit and the fourth parallel resonance unit and a cross-coupling capacitor, the suppression of the near end and the triple frequency of the passband is increased. In the designed band-pass filter, the suppression of stopband 0 to 3 GHz is more than 30 dB; the suppression of high-end stopband 7.8 GHz to 12.5 GHz is more than 30 dB; the suppression of triple frequency 12.5 to 17 GHz is more than 15 dB.

The above-described embodiment is a preferred embodiment of the present disclosure, and the present disclosure is not limited by the above-mentioned embodiment. Based on the embodiments of the present disclosure, other embodiments obtained by those of ordinary skill in the art without creative work, any modifications, equivalent replacements, and improvements made based on the present disclosure shall fall within the scope to be protected by the claims.

What is claimed is:

1. An ultra-wide passband five-order band-pass filter based on a low temperature co fired ceramic (LTCC) process, comprising a ceramic substrate, a bottom input electrode, a bottom output electrode and a bottom grounding electrode; wherein the ceramic substrate comprises five parallel resonators, a grounding polar plate, two series connection capacitors, two series connection inductors, a cross-coupling capacitor and a parallel inductor; the two series connection capacitors comprise a first series capacitor and a second series capacitor; the two series connection inductors comprise a first series inductor and a second series inductor; the five parallel resonators are distributed in mirror symmetry, comprising a first parallel resonator composed of a first inductor and a first parallel resonance capacitor, a second parallel resonator composed of a second inductor and a second parallel resonance capacitor, a third parallel resonator composed of a third inductor and a third parallel resonance capacitor, a fourth parallel resonator composed of a fourth inductor and a fourth parallel resonance capacitor, and a fifth parallel resonator composed of a fifth inductor and a fifth parallel resonance capacitor; the first parallel resonator and the second parallel resonator are connected through the first series capacitor, the second parallel resonator and the third parallel resonator are connected through the first series inductor, the third parallel resonator and the fourth parallel resonator are connected through the second series inductor, the fourth parallel resonator and the fifth parallel resonator are connected through the second series capacitor; a lower end of the first parallel resonance capacitor is connected to the bottom input electrode through a first hole pillar; a lower end of the fifth parallel resonance capacitor is connected to the bottom output electrode through a second hole pillar; the grounding polar plate is located at a bottommost layer inside the ceramic substrate and is connected to the bottom grounding electrode through a third hole pillar;

wherein a material of the ceramic substrate is a ceramic material with a dielectric constant of 9.8 and a dissipation factor of 0.003, and the bottom grounding electrode, the bottom input electrode, and the bottom output electrode are all printed with a silver material, a passband range of the ultra-wide passband five-order band-pass filter is 3.64 to 7.04 GHz, a maximum insertion loss of a passband is 1.75 dB, and a suppression in a low-end stopband of 0 to 3 GHz is more than 30 dB; a suppression in a high-end stopband of 7.8 GHz to 12.5 GHz is more than 30 dB; and a suppression of a triple frequency of 12.5 to 17 GHz is more than 15 dB.

2. An ultra-wide passband five-order band-pass filter based on a low temperature co fired ceramic (LTCC) process, comprising a ceramic substrate, a bottom input electrode, a bottom output electrode and a bottom grounding electrode; wherein the ceramic substrate comprises five parallel resonators, a grounding polar plate, two series connection capacitors, two series connection inductors, a cross-coupling capacitor and a parallel inductor; the two series connection capacitors comprise a first series capacitor and a second series capacitor; the two series connection inductors comprise a first series inductor and a second series inductor; the five parallel resonators are distributed in mirror symmetry, comprising a first parallel resonator composed of a first inductor and a first parallel resonance capacitor, a second parallel resonator composed of a second inductor and a second parallel resonance capacitor, a third parallel resonator composed of a third inductor and a third parallel resonance capacitor, a fourth parallel resonator composed of a fourth inductor and a fourth parallel resonance capacitor, and a fifth parallel resonator composed of a fifth inductor and a fifth parallel resonance capacitor; the first parallel resonator and the second parallel resonator are connected through the first series capacitor, the second parallel resonator and the third parallel resonator are connected through the first series inductor, the third parallel resonator and the fourth parallel resonator are connected through the second series inductor, the fourth parallel resonator and the fifth parallel resonator are connected through the second series capacitor; a lower end of the first parallel resonance capacitor is connected to the bottom input electrode through a first hole pillar; a lower end of the fifth parallel resonance capacitor is connected to the bottom output electrode through a second hole pillar; the grounding polar plate is located at a bottommost layer inside the ceramic substrate and is connected to the bottom grounding electrode through a third hole pillar;

wherein an interior of the ceramic substrate is divided into ten layers, and the grounding polar plate is located on a tenth layer of the ceramic substrate, the first inductor comprises a fourth hole pillar, a first double-layer polar plate and a fifth hole pillar; the first double-layer polar plate is located on a first layer and a second layer of the ceramic substrate; the fourth hole pillar is located between the first layer and the tenth layer of the ceramic substrate, with an upper end connected to the first double-layer polar plate, and a lower end connected to the grounding polar plate; the fifth hole pillar is located between the first layer and an eighth layer of the ceramic substrate, and is with an upper end the first double-layer polar plate, and a lower end connected to the first parallel resonance capacitor; the first parallel resonance capacitor is located on a sixth layer and the eighth layer of the ceramic substrate, and is with a left end connected to the fifth hole pillar of the first inductor, the first series capacitor is located on the sixth layer and the eighth layer of the ceramic substrate, and left ends of the sixth and eighth layers are connected to a right end of the first parallel resonance capacitor.

3. The ultra-wide passband five-order band-pass filter based on the LTCC process according to claim 2, wherein the second inductor comprises a sixth hole pillar, a second double-layer polar plate, and a seventh hole pillar; the second double-layer polar plate is located on the first layer and the second layer of the ceramic substrate; the sixth hole pillar is located between the first layer and the tenth layer of the ceramic substrate, and is with an upper end connected to the second double-layer polar plate, and a lower end connected to the grounding polar plate; the seventh hole pillar is located between the first layer and a ninth layer of the ceramic substrate, and is with an upper end connected to the second double-layer polar plate, the second parallel resonance capacitor is located on a seventh layer and the ninth layer of the ceramic substrate, and is connected to a lower end of the seventh hole pillar of the second inductor.

4. The ultra-wide passband five-order band-pass filter based on the LTCC process according to claim 3, wherein the third inductor comprises a eighth hole pillar, a third double-layer polar plate, and a ninth hole pillar; the third double-layer polar plate is located on the first layer and the second layer of the ceramic substrate; the eighth hole pillar is located between the first layer and the tenth layer of the ceramic substrate, and is with an upper end connected to the second double-layer polar plate, and a lower end connected to the grounding polar plate; the ninth hole pillar is located between the first layer and the ninth layer of the ceramic substrate, and is with an upper end connected to the third double-layer polar plate, the third parallel resonance capacitor is located on the seventh layer and the ninth layer of the ceramic substrate, and is connected to a lower end of the ninth hole pillar of the third inductor; the first series inductor is located on a third layer of the ceramic substrate, and is with a left end connected to the sixth hole pillar of the second inductor, and a right end connected to the eighth hole pillar of the third inductor.

5. The ultra-wide passband five-order band-pass filter based on the LTCC process according to claim 4, wherein the fourth inductor comprises a tenth hole pillar, a fourth double-layer polar plate, and a eleventh hole pillar; the fourth double-layer polar plate is located on the first layer and the second layer of the ceramic substrate; the tenth hole pillar is located between the first layer and the tenth layer of the ceramic substrate, and is with an upper end connected to the fourth double-layer polar plate, and a lower end connected to the grounding polar plate; the eleventh hole pillar is located between the first layer and the ninth layer of the ceramic substrate, and is with an upper end connected to the fourth double-layer polar plate, the fourth parallel resonance capacitor is located on the seventh layer and the ninth layer of the ceramic substrate, and is connected to a lower end of the eleventh hole pillar of the fourth inductor; the second series inductor is located on the third layer of the ceramic substrate, and is with a left end connected to the eighth hole pillar of the third inductor, and a right end connected with the tenth hole pillar of the fourth inductor.

6. The ultra-wide passband five-order band-pass filter based on the LTCC process according to claim 5, wherein the fifth inductor comprises a twelfth hole pillar, a fifth double-layer polar plate, and a thirteenth hole pillar; the fifth double-layer polar plate is located on the first layer and the second layer of the ceramic substrate; the twelfth hole pillar is located between the first layer and the tenth layer of the ceramic substrate, and is with an upper end connected to the fifth double-layer polar plate, and a lower end connected to the grounding polar plate; the thirteenth hole pillar is located between the first layer and the eighth layer of the ceramic substrate, and is with an upper end connected to the fifth double-layer polar plate, the fifth parallel resonance capacitor is located on the sixth layer and the eighth layer of the ceramic substrate, and is with a left end connected to a lower end of the thirteenth hole pillar of the fifth inductor, and a right end connected to the second series capacitor.

7. The ultra-wide passband five-order band-pass filter based on the LTCC process according to claim 6, wherein the cross-coupling capacitor is located on a fifth layer of the ceramic substrate, and adopts an in-line structure to form coupling with a sixth-layer polar plate of the first parallel resonance capacitor and a sixth-layer polar plate of the fifth parallel resonance capacitor; the parallel inductor is located on the third layer of the ceramic substrate, and adopts a C-shaped structure, and is respectively connected with the sixth hole pillar of the second inductor and the tenth hole pillar of the fourth inductor.

8. The ultra-wide passband five-order band-pass filter based on the LTCC process according to claim 2, wherein hole pillars of the first inductor, the second inductor, the third inductor, the fourth inductor, and the fifth inductor all adopt a pillar-shaped metal hole pillar structure; the first parallel resonance capacitor, the second parallel resonance capacitor, the third parallel resonance capacitor, the fourth parallel resonance capacitor, the fifth parallel resonance capacitor and the cross-coupling capacitor all adopt a structure of a pair of flat capacitor plates; the first series capacitor and the second series capacitor adopt a vertical in-line capacitor plate structure.

9. The ultra-wide passband five-order band-pass filter based on the LTCC process according to claim 2, wherein structures of the first parallel resonator and the fifth parallel resonator, the second parallel resonator and the fourth parallel resonator, the first series capacitor and the second series capacitor, and the first series inductor and the second series inductor are mirror-symmetrical, and structures of the third parallel resonator, the cross-coupling capacitor, and the parallel inductor are centrally symmetrical.

\* \* \* \* \*